(12) United States Patent
Kim

(10) Patent No.: US 9,064,825 B2
(45) Date of Patent: Jun. 23, 2015

(54) ORGANIC LIGHT-EMITTING DISPLAY APPARATUS AND METHOD OF MANUFACTURING THE SAME

(71) Applicant: Sung-Ho Kim, Yongin (KR)

(72) Inventor: Sung-Ho Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 13/923,432

(22) Filed: Jun. 21, 2013

(65) Prior Publication Data

US 2014/0138642 A1    May 22, 2014

(30) Foreign Application Priority Data

Nov. 21, 2012  (KR) .......................... 10-2012-0132595

(51) Int. Cl.
*H01L 29/08*  (2006.01)
*H01L 27/32*  (2006.01)
*H01L 51/52*  (2006.01)

(52) U.S. Cl.
CPC ........ *H01L 27/3244* (2013.01); *H01L 51/5209* (2013.01); *H01L 51/5275* (2013.01); *H01L 2227/323* (2013.01)

(58) Field of Classification Search
CPC ..................... H01L 51/5209; H01L 51/5275
USPC .......................................................... 257/40
See application file for complete search history.

(56) References Cited

U.S. PATENT DOCUMENTS

| | | | |
|---|---|---|---|
| 7,619,357 B2 * | 11/2009 | Onishi et al. .................. | 313/506 |
| 2010/0052518 A1 * | 3/2010 | Jeon et al. ..................... | 313/504 |
| 2010/0091228 A1 * | 4/2010 | Kim et al. ..................... | 349/122 |
| 2013/0115726 A1 | 5/2013 | Kim et al. | |

FOREIGN PATENT DOCUMENTS

| | | |
|---|---|---|
| JP | 2005-268046 A | 9/2005 |
| KR | 10 2004-0037889 A | 5/2004 |
| KR | 10 2013-0050164 A | 5/2013 |

* cited by examiner

*Primary Examiner* — Douglas Menz
(74) *Attorney, Agent, or Firm* — Lee & Morse, P.C.

(57) ABSTRACT

An organic light-emitting display apparatus includes a substrate, a thin film transistor (TFT) on the substrate, the TFT including an active layer, a gate electrode, a source electrode, and a drain electrode, an uneven pattern unit on the substrate and spaced apart from the TFT, the uneven pattern including an insulating film, a pixel electrode on the uneven pattern unit, an intermediate layer on the pixel electrode and including an organic light-emitting layer, and a counter electrode on the intermediate layer.

27 Claims, 9 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 10-2012-0132595, filed on Nov. 21, 2012, in the Korean Intellectual Property Office, the disclosure of which is incorporated herein in its entirety by reference.

BACKGROUND

1. Field

Example embodiments relate to an organic light-emitting display apparatus and a method of manufacturing the same, and more particularly, to an organic light-emitting display apparatus which may simplify a manufacturing process and reduce a color shift according to a viewing angle, and a method of manufacturing the organic light-emitting display apparatus.

2. Description of the Related Art

Organic light-emitting display apparatuses receive attention as next-generation display apparatuses because of their low-voltage operation, light and thin design, wide viewing angle, excellent contrast, and fast response.

SUMMARY

Example embodiments provide an organic light-emitting display apparatus which may reduce a color shift according to a viewing angle by using a resonance structure having an uneven portion, and a method of manufacturing the organic light-emitting display apparatus.

According to an aspect of the example embodiments, there is provided an organic light-emitting display apparatus including a substrate, a thin film transistor (TFT) on the substrate, the TFT including an active layer, a gate electrode, a source electrode, and a drain electrode, an uneven pattern unit on the substrate and spaced apart from the TFT, the uneven pattern including an insulating film, a pixel electrode on the uneven pattern unit, an intermediate layer on the pixel electrode and including an organic light-emitting layer, and a counter electrode on the intermediate layer.

The organic light-emitting display apparatus may further include a buffer layer that is disposed between the substrate and the TFT, wherein the uneven pattern unit further includes the buffer layer.

The uneven pattern unit may be formed such that an uneven pattern formed on the buffer layer exposes a surface of the substrate.

The uneven pattern unit may be formed by partially etching the buffer layer in a thickness direction of the buffer layer such that an uneven pattern formed on the buffer layer does not expose a surface of the substrate.

The uneven pattern unit may include the insulating film that is formed on the same layer as an insulating film constituting the TFT.

The TFT may be formed by sequentially stacking the active layer, the gate electrode, and the source electrode and the drain electrode, wherein a gate insulating film is formed between the active layer and the gate electrode, an interlayer insulating film is formed between the gate electrode and the source electrode and the drain electrode, and the uneven pattern unit includes the insulating film that is formed on the same layer as the gate insulating film.

The interlayer insulating film may form an opening in the substrate, wherein the uneven pattern unit is formed in the opening.

The pixel electrode may include a transparent conductive material.

The pixel electrode may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

The uneven pattern unit may be formed by stacking at least two insulating films.

The at least two insulating films may have different refractive indices.

The at least two insulating films may have the same etched surface.

The gate electrode may further include a semi-transparent metal layer, wherein the uneven pattern unit further includes the semi-transparent metal layer formed on the insulating film.

The organic light-emitting display apparatus may further include a first electrode of a capacitor which is formed on the same layer as the active layer, and a second electrode of the capacitor which is formed of the same material as a material of the pixel electrode.

A gate insulating film of the TFT may be a dielectric film of the capacitor.

The counter electrode may be a reflective electrode.

The organic light-emitting display apparatus may further include a pixel-defining film that covers the TFT, is spaced apart from the TFT, is formed on the substrate, and has an opening therein, wherein the pixel electrode is disposed in the opening formed in the pixel-defining film.

According to another aspect of the example embodiments, there is provided a method of manufacturing an organic light-emitting display apparatus including a first mask operation of forming a semiconductor layer on a substrate, and forming an active layer of a thin film transistor (TFT) by patterning the semiconductor layer, a second mask operation of forming a first insulating layer, stacking a first conductive layer on the first insulating layer, and forming a gate electrode of the TFT and an etch stop unit at a side of the gate electrode by patterning the first conductive layer, a third mask operation of forming a second insulating layer, forming a first opening through which the active layer by patterning the second insulating layer, and forming an uneven pattern unit by patterning a portion of the first insulating layer exposed to the etch stop unit; a fourth mask operation of forming a second conductive layer, and forming a source electrode and a drain electrode by patterning the second conductive layer, a fifth mask operation of forming a third conductive layer (anode), and forming a pixel electrode on the uneven pattern unit by patterning the third conductive layer, and a sixth mask operation of forming a third insulating layer, and forming an opening through which the pixel electrode is exposed.

The method may further include forming a buffer layer on the substrate, wherein the third mask operation includes forming the uneven pattern unit including the buffer layer.

An uneven pattern formed on the buffer layer may be formed to expose a surface of the substrate.

The buffer layer may be partially etched in a thickness direction of the buffer layer such that an uneven pattern formed on the buffer layer does not expose a surface of the substrate.

The fourth mask operation may include removing the etch stop unit remaining on the uneven pattern unit.

The second mask operation may include further stacking a semi-transparent metal layer between the first insulating layer and the first conductive layer, wherein the etch stop unit is formed to include the semi-transparent metal layer.

The first mask operation may include further forming a first electrode of a capacitor on the same layer as the active layer.

The fifth mask operation may include further forming a second electrode of the capacitor on the same layer as the pixel electrode.

After the second mask operation, the method may further include performing a first doping process.

After the fourth mask operation, the method may further include performing a second doping process.

BRIEF DESCRIPTION OF THE DRAWINGS

The above and other features and advantages will become more apparent by describing in detail exemplary embodiments with reference to the attached drawings, in which.

DETAILED DESCRIPTION

Figure 1:
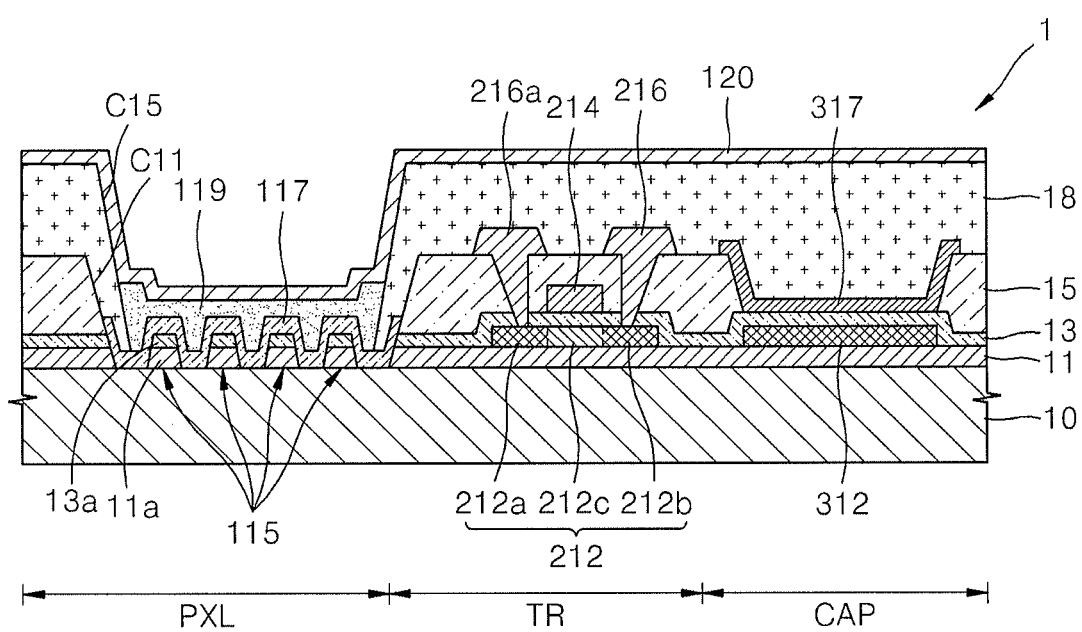
FIG. 1 is a cross-sectional view illustrating an organic light-emitting display apparatus according to an embodiment.

Example embodiments will now be described more fully with reference to the accompanying drawings. Embodiments may, however, be embodied in many different forms and should not be construed as being limited to the example embodiments set forth herein; rather, these embodiments are provided so that this disclosure will be thorough and complete, and will fully convey the concept of the invention to those of ordinary skill in the art.

Also, parts in the drawings unrelated to the detailed description are omitted to ensure clarity of the example embodiments. Like reference numerals in the drawings denote like elements. In various embodiments, elements having the same structure denoted by the same reference numeral are exemplarily explained in a first embodiment, and structures other than those in the first embodiment will be explained in other embodiments. Also, sizes and thicknesses of elements in the drawings may be arbitrarily shown for convenience of explanation, and thus are not limited to those as shown, e.g., various layers and regions are enlarged for clarity in the drawings.

As used herein, the term "and/or" includes any and all combinations of one or more of the associated listed items. Expressions such as "at least one of," when preceding a list of elements, modify the entire list of elements and do not modify the individual elements of the list. It will also be understood that when a layer, film, region, or plate is referred to as being "on" another layer, film, region, or plate, it can be directly on the other layer, film, region, or plate, or intervening layers, films, regions, or plates may also be present therebetween.

Unless the context dictates otherwise, the word "comprise" or variations such as "comprises" or "comprising" is understood to mean "includes, but is not limited to" such that other elements that are not explicitly mentioned may also be included. Also, it will be understood that the term "on" encompasses orientations of both "over" and "under" without being limited to "over" in a direction in which gravity is applied.

FIG. 1 is a cross-sectional view illustrating an organic light-emitting display apparatus 1 according to an embodiment. Referring to FIG. 1, a substrate 10 includes a pixel area PXL, a transistor area TR, and a capacitor area CAP.

The substrate 10 may be a transparent substrate such as a glass substrate or a plastic substrate, e.g., including polyethylene terephthalate (PET), polyethylene naphthalate (PEN), and/or polyimide.

A buffer layer 11 may be disposed on the substrate 10. The buffer layer 11 for preventing penetration of impurity elements and planarizing the substrate 10 may have a single or multi-layer structure formed of e.g., silicon nitride and/or silicon oxide. A patterned buffer layer 11a including an uneven pattern in the pixel area PXL and an uneven pattern 13a of a gate insulating film 13, which will be explained below, constitute an uneven pattern unit 115.

An active layer 212 is disposed on the buffer layer 11. The active layer 212 may be formed of a semiconductor including amorphous silicon or polysilicon. The active layer 212 may include a channel region 212c, and a source region 212a and a drain region 212b that are disposed outside the channel region 212 and are doped with ion impurities.

In the transistor area TR, a gate electrode 214 is disposed on the active layer 212 to correspond in position to the channel region 212c of the active layer 212 with the first insulating layer 13, i.e., a gate insulating film, therebetween. The gate electrode 214 may have a single or multi-layer structure including at least one metal, e.g., aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

A source electrode 216a and a drain electrode 216b which are respectively connected to the source region 212a and the drain region 212b of the active layer 212 are disposed on the gate electrode 214 with a second insulating layer 15, i.e., an interlayer insulating film, therebetween. Each of the source electrode 216a and the drain electrode 216b may include at least one metal material e.g., Al, Pt, Pd, Ag, Mg, Au, Ni, Nd, Ir, Cr, Li, Ca, Mo, Ti, W, and/or Cu, and may have a single or multi-layer structure.

A third insulating layer 18, e.g., pixel-defining film, is disposed on the second insulating layer 15 to cover the source electrode 216a and the drain electrode 216b. The third insulating layer 18 may be an organic insulating film.

The third insulating film 18 includes an opening C15 in the pixel area PXL, i.e., a portion of the third insulating film 18 is removed from the pixel area PXL, and the uneven pattern unit 115 is formed in the pixel area PXL. In detail, exposed portions of the buffer layer 11 and the first insulating layer 13 in the pixel area PXL are patterned, e.g., simultaneously, to form respective uneven patterns 11a and 13a. The uneven patterns 11a and 13a have a same etched surface, e.g., respective lateral surfaces of the uneven patterns 11a and 13a may be coplanar to define a uniformly flat surface, to define the uneven pattern unit 115. For example, the uneven pattern unit 115 may have a cross-section of a plurality of multi-layered trapezoids spaced apart from each other, as illustrated in FIG. 1.

Each of the buffer layer 11 and the first insulating layer 13, portions of which define the uneven pattern unit 115, may be an insulating layer having a single or multi-layer structure. The buffer layer 11 and the first insulating layer 13 may be formed of insulating layers having different refractive indices. Since a plurality of insulating layers with different refractive indices form a distributed bragg reflector (DBR) resonance structure, light extraction efficiency and color reproduction of the organic light-emitting display apparatus 1 are improved. Also, a color shift at a side surface of the organic light-emitting display apparatus 1 may be efficiently reduced due to an uneven pattern. Each of the buffer layer 11 and the first insulating layer 13 may include at least one selected of $SiN_x$, $SiO_2$, SiON, $HfO_2$, $Si_3N_4$, $ZrO_2$, $TiO_2$, $Ta_2O_4$, $Ta_2O_5$, $Nb_2O_5$, $Al_2O_3$, BST, and PZT.

Figure 3:
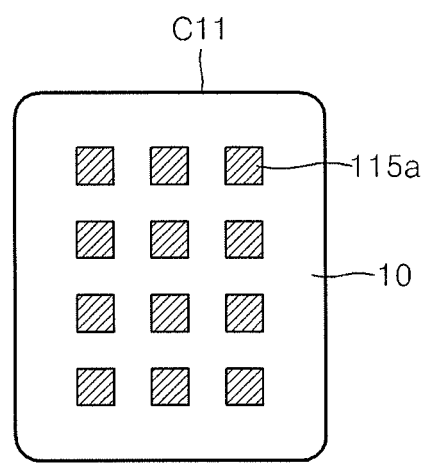
FIGS. 3 and 4 are plan views illustrating uneven pattern units according to embodiments.
Figure 4:
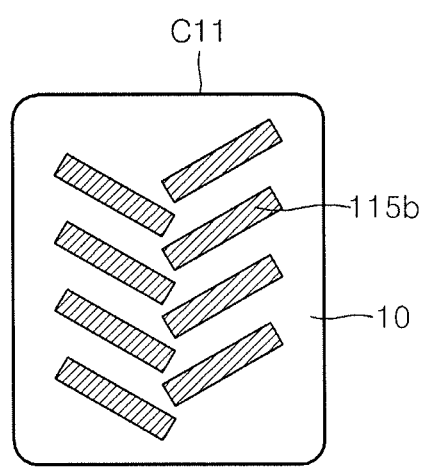

The uneven pattern unit 115 may have various shapes, as will be discussed in more detail with reference to FIGS. 3 and 4. FIGS. 3 and 4 are plan views illustrating uneven pattern units 115a and 115b according to embodiments.

For example, as illustrated in FIG. 3, the uneven pattern unit 115a has an island-like square shape, e.g., arranged in a matrix pattern. In another example, as illustrated in FIG. 4, the uneven pattern unit 115b has a stick shape, e.g., arranged in overlapping columns. The present embodiment is not limited thereto, and the uneven pattern unit 115 may be manufactured to have any of various other shapes, e.g., a circular shape, a triangular shape, and a pentagonal shape.

Referring back to FIG. 1, a pixel electrode 117 is formed, e.g., conformally, on the uneven pattern unit 115 along an uneven pattern. The pixel electrode 117 may be formed of a transparent conductive material. The transparent conductive material may include at least one of indium tin oxide (ITO), indium zinc oxide (IZO), zinc oxide (ZnO), indium oxide (In2O3), indium gallium oxide (IGO), and aluminum zinc oxide (AZO).

An intermediate layer (not shown) including an organic light-emitting layer 119 is disposed on the pixel electrode 117. The organic light-emitting layer 119 may be formed of a low molecular weight organic material or a high molecular weight organic material. When the organic light-emitting layer 119 is formed of a low molecular weight organic material, a hole transport layer (HTL), a hole injection layer (HIL), an electron transport layer (ETL), and an electron injection layer (EIL) may be stacked on the intermediate layer. Various other layers may be stacked if necessary. In this case, examples of the low molecular weight organic material may include copper phthalocyanine (CuPc), N'-diphenyl-benzidine (NPB), and tris-8-hydroxyquinoline aluminum (Alq3). When the organic light-emitting layer 119 is formed of a high molecular weight organic material, however, the intermediate layer may include a HTL. The HTL may be formed of, e.g., poly-(3,4)-ethylene-dihydroxy thiophene (PEDOT) or polyaniline (PANI). In this case, examples of the high molecular weight organic material may include a poly-Phenylenevinylene (PPV)-based high molecular weight organic material and a polyfluorene-based high molecular weight organic material. In the organic light-emitting layer 119, subpixels emitting red, green, and blue light may define one unit pixel.

Although the organic light-emitting layer 119 is formed in the opening C15 and a separate light-emitting material is formed according to each pixel in FIG. 1, the present embodiment is not limited thereto. The organic light-emitting layer 119 may be commonly formed on an entire surface of the third insulating layer 18 irrespective of positions of pixels. In this case, the organic light-emitting layer 119 may be formed, for example, by vertically stacking or mixing layers including light-emitting materials emitting red, green, and blue light.

A counter electrode 120 is deposited, e.g., as a common electrode, on the organic light-emitting layer 119. In the organic light-emitting display apparatus 1, the pixel electrode 117 is used as an anode and the counter electrode 120 is used as a cathode. Alternatively, the pixel electrode 117 may be used as a cathode and the counter electrode 120 may be used as an anode.

The counter electrode 120 may be a reflective electrode including a reflective material. The counter electrode 120 may include at least of Ag, Al, Gm, Li, Ca, LiF/Ca, and LiF/Al.

Since the counter electrode 120 is a reflective electrode, light emitted from the organic light-emitting layer 119 is reflected by the counter electrode 120 and is transmitted through the pixel electrode 117, which is formed of a transparent conductive material. Further, light transmitted through the pixel electrode 117 toward the substrate 10 via the uneven pattern unit 115. In this case, due to the DBR resonance structure of the uneven pattern unit 115, light extraction efficiency and color reproduction of the organic light-emitting display apparatus 1 may be improved and a color shift may be reduced due to an uneven structure formed by the uneven pattern unit 115.

In the capacitor area CAP, a first electrode 312 of a capacitor, which is formed on the substrate 10, is formed on the same layer as the active layer 212. The first insulating layer 13 extends to form a dielectric film of the capacitor. A second electrode 317 of the capacitor, which is formed of the same material as a material of the pixel electrode 117, is formed on the first insulating layer 13.

Since the second insulating layer 15, which functions as an interlayer insulating layer in the transistor area TR, does not function as a dielectric film of the capacitor, materials and thicknesses of the second insulating layer 15 and the first insulating layer 13 may be adjusted according to characteristics of the transistor and the capacitor. Accordingly, a thickness of the second insulating layer 15 may be sufficiently great, e.g., equal to or greater than 0.5 μm, without considering an electric capacity of the capacitor.

The third insulating layer 18 is disposed on the second electrode 317 of the capacitor. Since the third insulating layer 18, which includes an organic insulating material having a low dielectric constant, is disposed between the counter electrode 120 and the second electrode 317 of the capacitor, a parasitic capacitance which may be potentially formed between the counter electrode 120 and the second electrode 317 of the capacitor may be reduced, thereby preventing signal interference due to the parasitic capacitance.

FIGS. 2A through 2F are cross-sectional views of, e.g., sequential, stages in a method of manufacturing the organic light-emitting display apparatus 1 according to an embodiment.

Figure 2A:
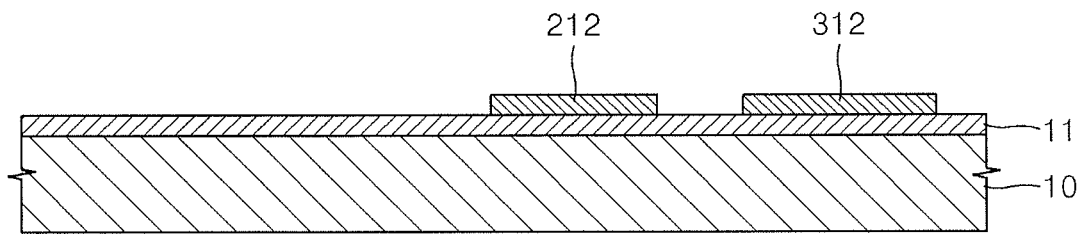
FIGS. 2A through 2F are cross-sectional views of a method for manufacturing an organic light-emitting display apparatus according to an embodiment.

Referring to FIG. 2A, which illustrates a resultant structure of a first mask operation, the buffer layer 11 is formed on the substrate 10, and the active layer 212 and the first electrode 312 of the capacitor are formed on the buffer layer 11. Although not shown in FIG. 2A, a semiconductor layer (not shown) is formed on the buffer layer 11 and a photoresist (not shown) is applied. Next, the semiconductor layer is patterned by using photolithography using a first mask (not shown) to form the active layer 212 and the first electrode 312 of the capacitor.

The semiconductor layer may include amorphous silicon or polysilicon. The semiconductor layer may be deposited on the buffer layer 11 by using any suitable method, e.g., plasma enhanced chemical vapor deposition (PECVD), atmospheric pressure CVD (APCVD), and low pressure CVD (LPCVD).

The first mask operation using photolithography includes performing exposure using an exposure device on the first mask, and performing a series of processes, e.g., developing, etching, stripping, and ashing. Next, the same description as that in the first mask operation will not be given in the following mask operations.

Figure 2B:
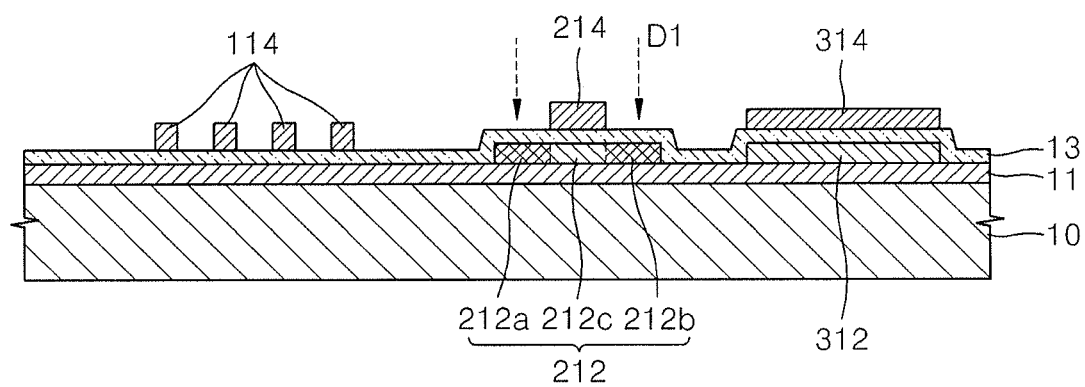

Referring to FIG. 2B, which illustrates a resultant structure of a second mask operation, the first insulating layer 13 is formed on an entire surface of the resultant structure of the first mask operation of FIG. 2A. The gate electrode 214, an etch stop unit 114 for an uneven pattern, and an etch stop unit 314 of the capacitor are formed on the first insulating layer 13.

Ion impurities D1 are doped into the active layer 212 by using the gate electrode 214 formed on the first insulating layer 13 as a self-aligned mask. The source region 212a and the drain region 212b doped with the ion impurities, as well as the channel region 212c undoped with the ion impurities, are formed.

Figure 2C:
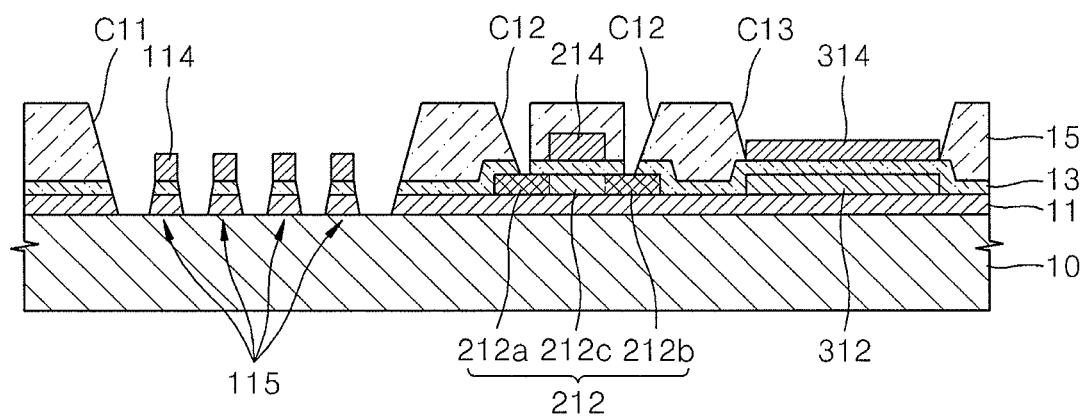

Referring to FIG. 2C, which illustrates a resultant structure of a third mask operation, the second insulating layer 15 is formed on the resultant structure of the second mask operation of FIG. 2B. The second insulating layer 15 is patterned by using a third mask (not shown) to form an opening C11 through which the pixel area PXL is exposed, a first opening C12 through which the source region 212a and the drain region 212b are exposed, and an opening C13 through which the capacitor area CAP is exposed.

In this case, portions of the buffer layer 11 and the first insulating layer 13 which are disposed under the etch stop unit 114 for an uneven pattern are not etched, and portions of the buffer layer 11 and the first insulating layer 13 which are disposed between the etch stop unit 114 are etched to form the uneven pattern unit 115. In other words, the uneven pattern unit 115 is formed during formation of the opening C11, e.g., etching of the second insulating layer 15 is performed simultaneously with etching the buffer layer 11 and the first insulating layer 13 through the etch stop unit 114. Also, the etch stop unit 314 of the capacitor prevents the first insulating layer 13, which is a dielectric film disposed under the etch stop unit 314, from being etched.

Figure 5:
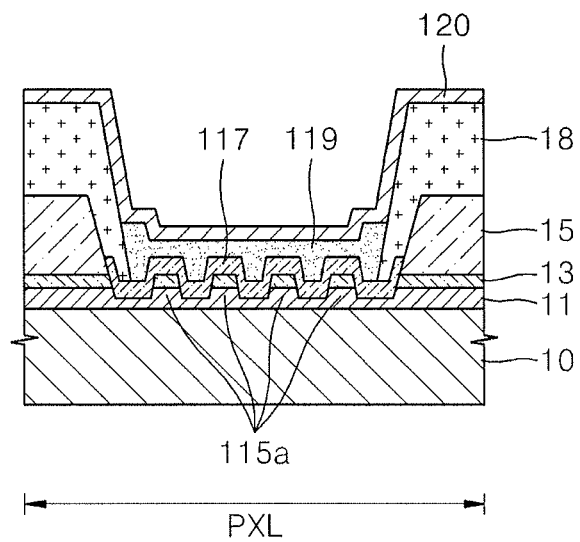
FIG. 5 is a cross-sectional view illustrating an uneven pattern unit according to an embodiment.

For example, when the uneven pattern unit 115 is formed, the buffer layer 11 may be entirely etched in a thickness direction of the buffer layer 11 to expose the substrate 10, as illustrated in FIG. 2C. In another example, the buffer layer 11 may be partially etched in the thickness direction of the buffer layer 11, as illustrated in FIG. 5.

Figure 2D:
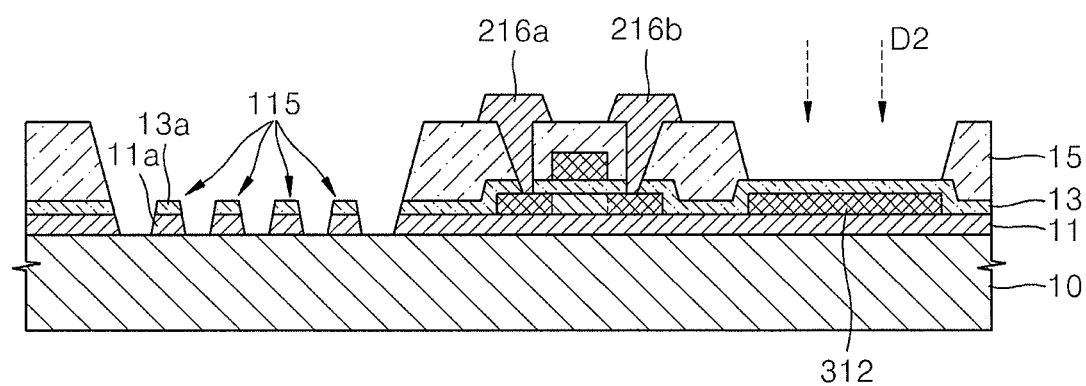

Referring to FIG. 2D, which illustrates a resultant structure of a fourth mask operation, the source electrode 216a and the drain electrode 216b are formed on the resultant structure of the third mask operation of FIG. 2C. When the source electrode 216a and the drain electrode 216b are patterned, the etch stop unit 114 for the uneven pattern 115 and the etch stop unit 314 of the capacitor are removed. Ion impurities D2 are doped into the resultant structure by using the first electrode 312 of the capacitor as a target.

Figure 2E:
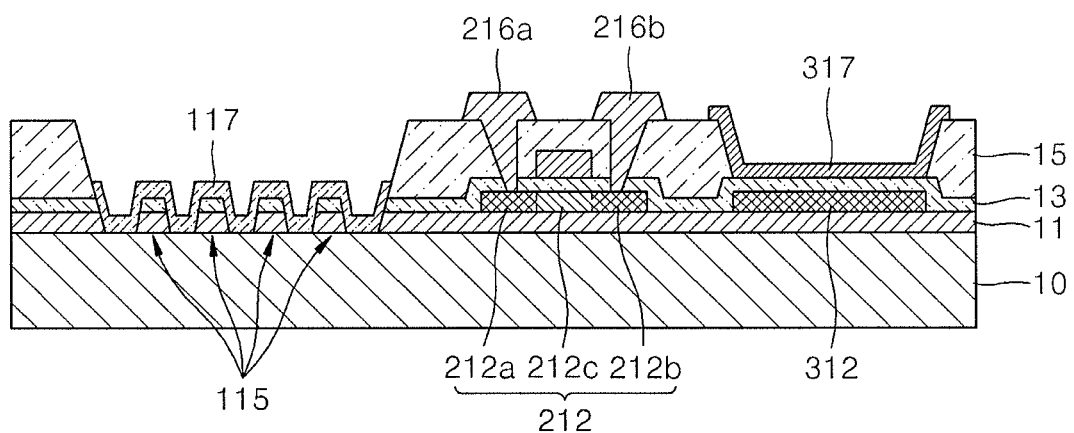

Referring to FIG. 2E, which illustrates a resultant structure of a fifth mask operation, the pixel electrode 117 and the second electrode 317 of the capacitor are formed on the resultant structure of the fourth mask operation of FIG. 2D. Each of the pixel electrode 117 and the second electrode 317 of the capacitor may be formed of a material including at least one transparent conductive material, e.g., ITO, IZO, ZnO, $In_2O_3$, IGO, and/or AZO.

Figure 2F:
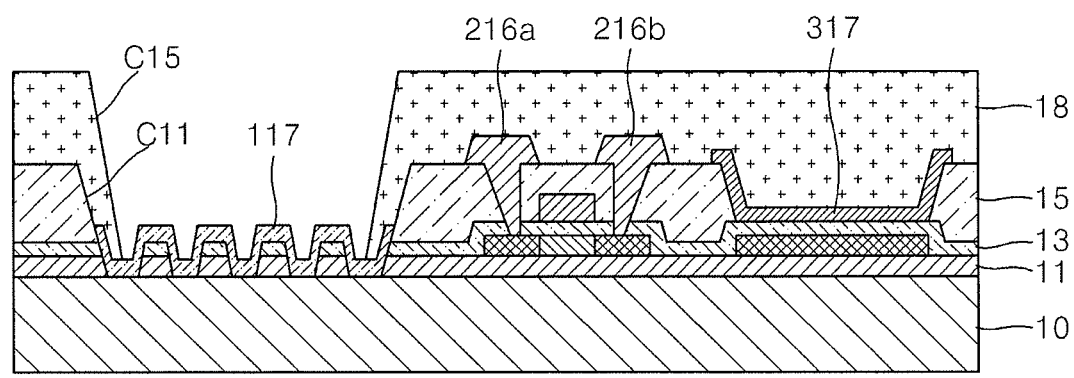

Referring to FIG. 2F, which illustrates a resultant structure of a sixth mask operation, the third insulating layer 18 is formed on the resultant structure of the fifth mask operation of FIG. 2E. The third insulating layer 18 is patterned to form the opening C15 through which the pixel electrode 117 is exposed.

Figure 6:
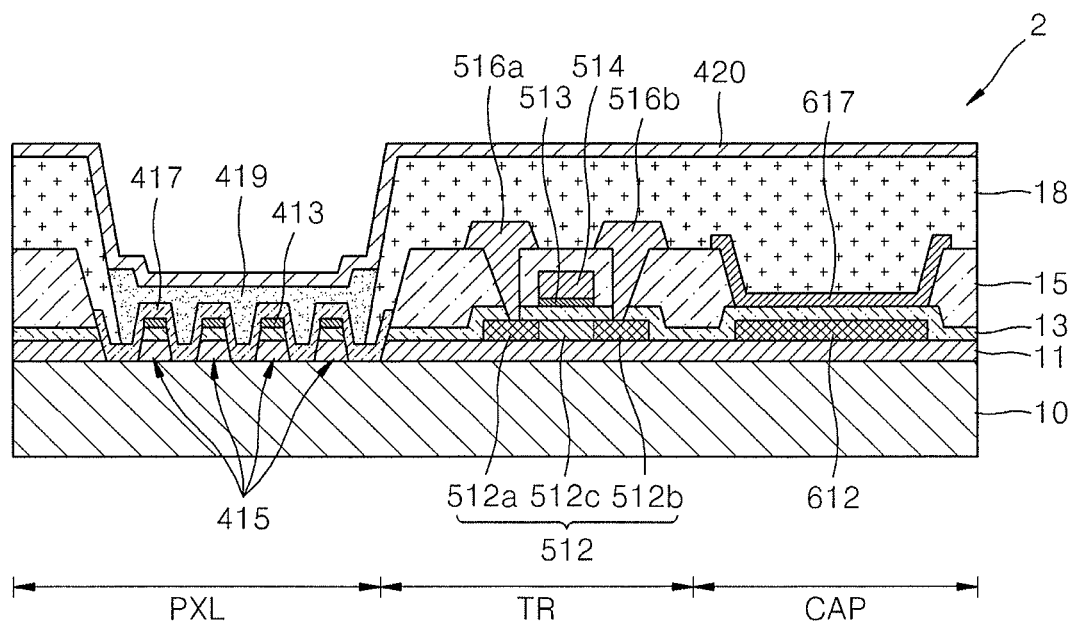
FIG. 6 is a cross-sectional view illustrating an organic light-emitting display apparatus according to another embodiment.

Another embodiment will be explained with reference to FIG. 6. FIG. 6 is a cross-sectional view illustrating an organic light-emitting display apparatus 2 according to another embodiment.

Referring to FIG. 6, the substrate 10 includes the pixel area PXL, the transistor area TR, and the capacitor area CAP.

In the transistor area TR, a TFT includes an active layer 512, two gate electrodes 513 and 514, and a source electrode 516a and a drain electrode 516b. The active layer 512 includes a channel region 512c undoped with ion impurities, and a source region 512a and a drain region 512b disposed outside the channel region 512c and doped with ion impurities.

In the capacitor area CAP, a first electrode 612 of a capacitor is formed on the same layer as the active layer 512, and a second electrode 617 of the capacitor is formed on the same layer as a pixel electrode 417. The first insulating layer 13, which is a gate insulating film of the TFT, functions as a dielectric film of the capacitor.

In the pixel area PXL, patterned portions of the buffer layer 11, the first insulating layer 13, and the gate electrode 513 define an uneven pattern unit 415. The gate electrode 513 may be formed of a transparent conductive material, e.g., ITO, IZO, ZnO, $In_2O_3$, IGO, and/or AZO.

The pixel electrode 417 may include a semi-transparent metal layer including at least one of Ag, Al, and an alloy thereof. In this case, since a counter electrode 420 is a reflective electrode, light emitted from an organic light-emitting layer 419 resonates between the pixel electrode 417, which is a semi-transparent electrode, and the counter electrode 420, which is a reflective electrode, thereby further improving light efficiency of the organic light-emitting display apparatus 2.

FIGS. 7A through 7F are cross-sectional views of, e.g., sequential, stages in a method of manufacturing the organic light-emitting display apparatus 2.

Figure 7A:
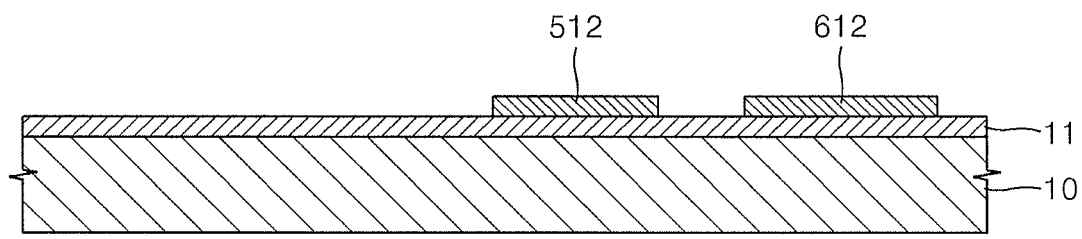
FIGS. 7A through 7F are cross-sectional views of a method for manufacturing an organic light-emitting display apparatus according to another embodiment.

Referring to FIG. 7A, which illustrates a resultant structure of a first mask operation, the buffer layer 11 is formed on the substrate 10, and the active layer 512 and the first electrode 612 of the capacitor are formed on the buffer layer 11.

Figure 7B:
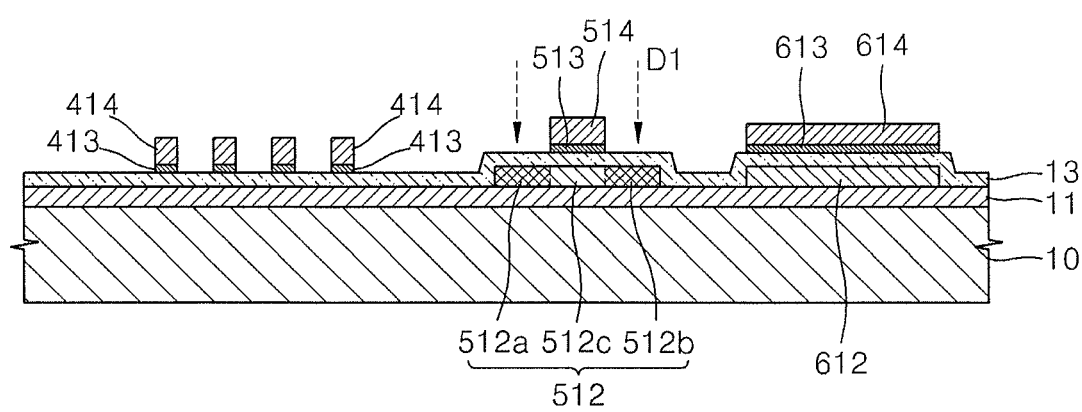

Referring to FIG. 7B, which illustrates a resultant structure of a second mask operation, the first insulating layer 13 is formed on an entire surface of the resultant structure of the first mask operation of FIG. 7A, a first layer (not shown) including a transparent conductive material and a second layer (not shown) including a low-resistance metal are sequentially stacked on the first insulating layer 13, and the first layer and the second layer are patterned to form the gate electrodes 513 and 514, etch stop units 414 and 413 for an uneven pattern, and etch stop units 613 and 614 of the capacitor.

Ion impurities D1 are doped into the active layer 512 by using the gate electrodes 513 and 514 formed on the first insulating layer 13 as self-aligned masks. The source region 512a and the drain region 512b doped with the ion impurities and the channel region 512c undoped with the ion impurities are formed.

Figure 7C:
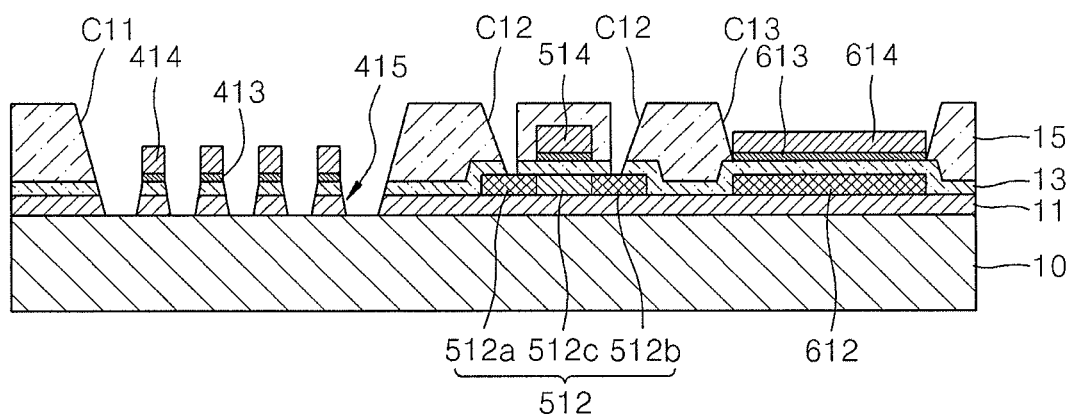

Referring to FIG. 7C, which illustrates a resultant structure of a third mask operation, the second insulating layer 15 is formed on the resultant structure of the second mask operation of FIG. 7B. The second insulating layer 15 is patterned by using a third mask (not shown) to form the opening C11 through which the pixel area PXL is exposed, the opening C12 through which the source region 512a and the drain region 512b are exposed, and the opening C13 through which the capacitor area CAP is exposed.

In this case, portions of the buffer layer 11 and the first insulating layer 13 which are disposed under the etch stop units 413 and 414 for an uneven pattern are not etched, and portions of the buffer layer 11 and the first insulating layer 13 which are disposed between the etch stop units 413 and 414 are etched, to form the uneven pattern unit 415. Also, the etch stop unit 314 of the capacitor prevents the first insulating layer 13 which is a dielectric film disposed under the etch stop unit 314 from being etched.

Figure 7D:
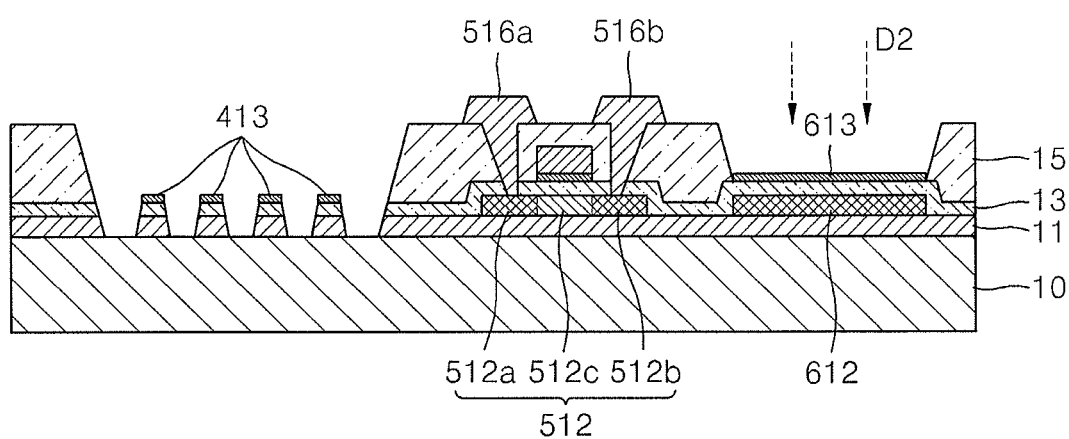

Referring to FIG. 7D, which illustrates a resultant structure of a fourth mask operation, the source electrode 516a and the drain electrode 516b are formed on the resultant structure of the third mask operation of FIG. 7C. When the source electrode 516a and the drain electrode 516b are patterned, the etch stop unit 414 for an uneven pattern and the etch stop unit 614 of the capacitor are removed, and the etch stop units 413 and 613 each formed of a transparent conductive material remain. Ion impurities D2 are doped in a resultant structure by using the first electrode 612 as a target.

Figure 7E:
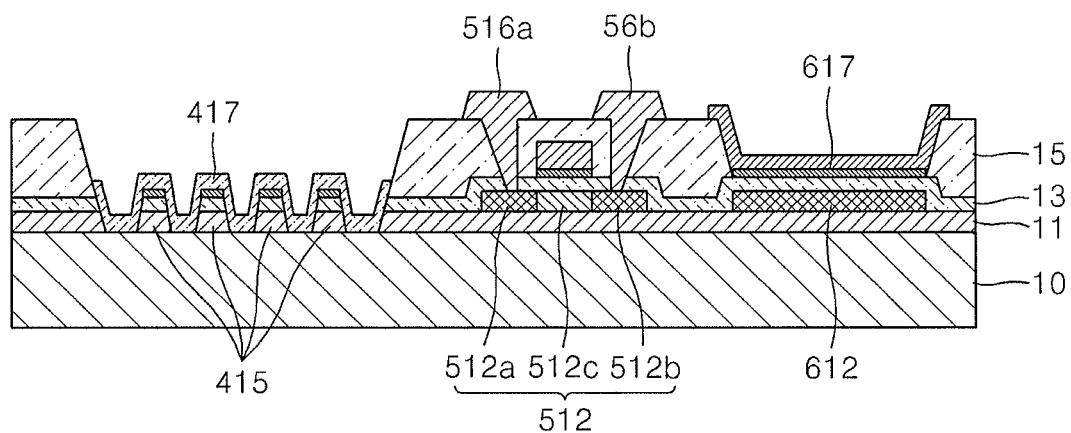

Referring to FIG. 7E, which illustrates a resultant structure of a fifth mask operation, the pixel electrode 417 and the second electrode 617 of the capacitor are formed on the resultant structure of the fourth mask operation of FIG. 7D. Each of the pixel electrode 147 and the second electrode 317 of the capacitor may include a semi-transparent metal layer including at least one of Ag, Al, and an alloy thereof.

Figure 7F:
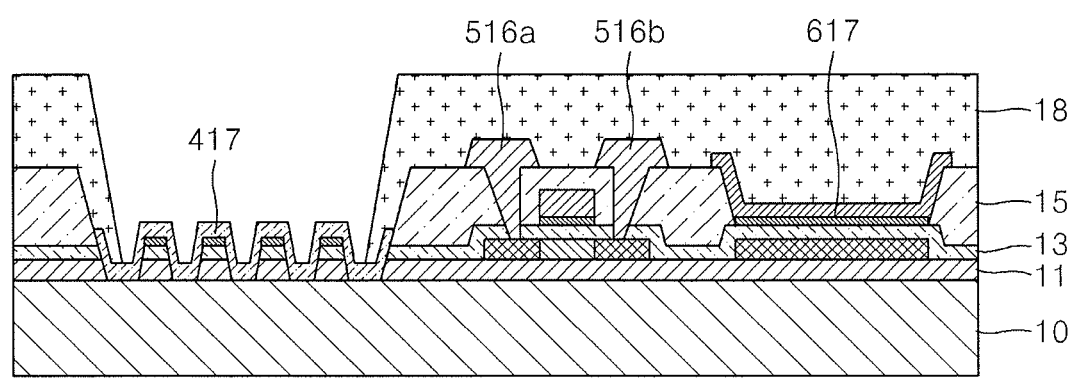

Referring to FIG. 7F, which illustrates a resultant structure of a sixth mask operation, the third insulating layer 18 is formed on the resultant structure of the fifth mask operation of FIG. 7E. The third insulating layer 18 is patterned to form the opening C15 through which the pixel electrode 417 is exposed.

An organic light-emitting display apparatus and a method of manufacturing the same according to the embodiments may reduce a color shift according to a viewing angle by using a resonance structure including an uneven portion. Also, an uneven pattern unit may be formed in a pixel area by using six (6) mask operations.

In general, since an organic light-emitting display apparatus has a wide emission wavelength, light-emitting efficiency and color purity are reduced. Also, since light emitted from an organic light-emitting layer has no specific directivity, many photons emitted in arbitrary directions are totally and internally reflected by an organic light-emitting device, thereby failing to reach an actual observer and reducing light extraction efficiency of the organic light-emitting device. While a conventional organic light-emitting display apparatus may include a distributed bragg reflector (DBR) mirror or a resonance structure for adjusting a thickness of an organic layer to improve light extraction efficiency, the conventional resonance structure may cause a color shift according to a viewing angle.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. An organic light-emitting display apparatus, comprising:
 a substrate;
 a thin film transistor (TFT) on the substrate, the TFT including an active layer, a gate electrode, a source electrode, and a drain electrode;
 an uneven pattern unit on the substrate and spaced apart from the TFT along a first direction, the uneven pattern unit including a plurality of protrusions spaced apart from each other along the first direction, each protrusion having at least two insulating films stacked on each other;
 a pixel electrode on the uneven pattern unit;
 an intermediate layer on the pixel electrode and including an organic light-emitting layer; and
 a counter electrode on the intermediate layer.

2. The organic light-emitting display apparatus as claimed in claim 1, further comprising a buffer layer between the substrate and the TFT, a lower layer of the two insulating films in each protrusion in the uneven pattern unit being a portion of the buffer layer,
 wherein an upper surface of the portion of the buffer layer in the uneven pattern unit and an upper surface of a portion of the buffer layer between the substrate and the TFT face a same direction and are level.

3. The organic light-emitting display apparatus as claimed in claim 2, wherein each of the portion of the buffer layer in the uneven pattern unit and of a portion of the buffer layer between the substrate and the TFT is directly on the substrate.

4. The organic light-emitting display apparatus as claimed in claim 2, wherein the portion of the buffer layer in the uneven pattern unit is patterned in a thickness direction of the buffer layer, the uneven pattern not exposing a surface of the substrate.

5. The organic light-emitting display apparatus as claimed in claim 1, wherein an upper layer of the two insulating films in the uneven pattern unit is a portion of an insulating film in the TFT.

6. The organic light-emitting display apparatus as claimed in claim 5, wherein:
 the TFT includes the active layer, the gate electrode, and the source electrode and the drain electrode sequentially stacked,
 a gate insulating film is positioned between the active layer and the gate electrode,
 an interlayer insulating film is positioned between the gate electrode and the source electrode and the drain electrode, and
 the upper layer of the two insulating films in the uneven pattern unit is a portion of the gate insulating film.

7. The organic light-emitting display apparatus as claimed in claim 6, wherein the interlayer insulating film of the TFT includes an opening exposing an upper surface of the substrate, the uneven pattern unit being in the opening.

8. The organic light-emitting display apparatus as claimed in claim 1, wherein the pixel electrode includes a transparent conductive material.

9. The organic light-emitting display apparatus as claimed in claim 8, wherein the pixel electrode includes at least one of indium tin oxide (ITO), indium zinc oxide (IZO), zinc oxide (ZnO), indium oxide ($In_2O_3$), indium gallium oxide (IGO), and aluminum zinc oxide (AZO).

10. The organic light-emitting display apparatus as claimed in claim 1, wherein the at least two insulating films have different refractive indices.

11. The organic light-emitting display apparatus as claimed in claim 1, wherein the at least two insulating films have side surfaces that are part of a same etched and even surface.

12. The organic light-emitting display apparatus as claimed in claim 1, wherein the gate electrode includes two layers, one layer of the two layers being a semi-transparent metal layer, and the uneven pattern unit further comprises a portion of the semi-transparent metal layer on the insulating film.

13. The organic light-emitting display apparatus as claimed in claim 1, further comprising a first electrode of a capacitor on a same layer as the active layer, and a second electrode of the capacitor including a same material as the pixel electrode.

14. The organic light-emitting display apparatus as claimed in claim 13, wherein a gate insulating film of the TFT is a dielectric film of the capacitor.

15. The organic light-emitting display apparatus as claimed in claim 1, wherein the counter electrode is a reflective electrode.

16. The organic light-emitting display apparatus as claimed in claim 1, further comprising a pixel-defining film covering the TFT and spaced apart from the TFT, the pixel-defining film being on the substrate and including an opening therein, and the pixel electrode being in the opening of the pixel-defining film.

17. The organic light-emitting display apparatus as claimed in claim 1, wherein the pixel electrode is conformal on the top and side surfaces of the plurality of protrusions of the uneven pattern.

18. The organic light-emitting display apparatus as claimed in claim 7, wherein the uneven pattern is only in a region exposed by the opening.

19. A method of manufacturing an organic light-emitting display apparatus, the method comprising:
- a first mask operation including forming a semiconductor layer on a substrate, and forming an active layer of a thin film transistor (TFT) by patterning the semiconductor layer;
- a second mask operation including forming a first insulating layer on the semiconductor layer, stacking a first conductive layer on the first insulating layer, and forming a gate electrode of the TFT and an etch stop unit at a side of the gate electrode by patterning the first conductive layer;
- a third mask operation including forming a second insulating layer, forming a first opening in the second insulating layer to expose the active layer by patterning the second insulating layer, and forming an uneven pattern unit spaced apart from the TFT along a first direction by patterning portions of the first and second insulating layers through the etch stop unit, such that a plurality of protrusions spaced apart from each other along the first direction and including at least two insulating films stacked on each other are defined in the uneven pattern unit;
- a fourth mask operation including forming a second conductive layer, and forming a source electrode and a drain electrode by patterning the second conductive layer;
- a fifth mask operation including forming a third conductive layer, and forming a pixel electrode on the uneven pattern unit by patterning the third conductive layer; and
- a sixth mask operation including forming a third insulating layer, forming an opening through the third insulating layer to expose the pixel electrode, and sequentially forming an intermediate layer and a counter electrode on the pixel electrode, such that the intermediate layer includes an organic light-emitting layer.

20. The method as claimed in claim 19, further comprising forming a buffer layer on the substrate, the third mask operation including forming the uneven pattern unit of a portion of the buffer layer.

21. The method as claimed in claim 20, wherein the portion of the buffer layer in the uneven pattern unit is patterned to expose a surface of the substrate.

22. The method as claimed in claim 20, wherein the portion of the buffer layer in the uneven pattern is partially etched in a thickness direction of the buffer layer, such that the uneven pattern does not expose a surface of the substrate.

23. The method as claimed in claim 19, wherein the second mask operation further comprises stacking a semi-transparent metal layer between the first insulating layer and the first conductive layer, the etch stop unit being formed to include the semi-transparent metal layer.

24. The method as claimed in claim 19, wherein the first mask operation further comprises forming a first electrode of a capacitor on the same layer as the active layer.

25. The method as claimed in claim 24, wherein the fifth mask operation further comprises forming a second electrode of the capacitor on the same layer as the pixel electrode.

26. The method as claimed in claim 19, wherein after the second mask operation, the method further comprises performing a first doping process.

27. The method as claimed in claim 19, wherein after the fourth mask operation, the method further comprises performing a second doping process.

* * * * *